(12) United States Patent
Saito et al.

(10) Patent No.: US 7,931,821 B2
(45) Date of Patent: Apr. 26, 2011

(54) OXYNITRIDE PIEZOELECTRIC MATERIAL AND METHOD OF PRODUCING THE SAME

(75) Inventors: Hiroshi Saito, Yokohama (JP); Takanori Matsuda, Chofu (JP); Kaoru Miura, Matsudo (JP); Kenji Takashima, Saitama (JP); Masaki Azuma, Kyoto (JP); Takashi Iijima, Tsukuba (JP); Hiroshi Funakubo, Yokohama (JP); Soichiro Okamura, Inagi (JP); Nobuhiro Kumada, Kofu (JP); Satoshi Wada, Kofu (JP)

(73) Assignees: Canon Kabushiki Kaisha, Tokyo (JP); Kyoto University, Kyoto (JP); Tokyo Institute of Technology, Tokyo (JP); University of Yamanashi, Yamanashi (JP); National Institute of Advanced Industrial Science and Technology, Tokyo (JP); Tokyo University of Science Educational Foundation Administrative Organization, Tokyo (JP)

( * ) Notice: Subject to any disclaimer, the term of this patent is extended or adjusted under 35 U.S.C. 154(b) by 1 day.

(21) Appl. No.: 12/639,473

(22) Filed: Dec. 16, 2009

(65) Prior Publication Data

US 2010/0155647 A1    Jun. 24, 2010

(30) Foreign Application Priority Data

Dec. 18, 2008    (JP) ................................. 2008-322831

(51) Int. Cl.
*C04B 35/495* (2006.01)
*C04B 35/00* (2006.01)

(52) U.S. Cl. ............ 252/62.9 R; 252/62.9 PZ; 501/136

(58) Field of Classification Search ............. 252/62.9 R, 252/62.9 PZ; 501/96.1, 134, 136, 137, 138
See application file for complete search history.

(56) References Cited

U.S. PATENT DOCUMENTS 4,734,390 A * 3/1988 Marchand et al. ........... 501/96.1
6,383,416 B1 * 5/2002 Hamada et al. ............. 252/521.5
(Continued)

FOREIGN PATENT DOCUMENTS
WO    2009/116683 A1    9/2009

OTHER PUBLICATIONS

Razvan Caracas et al., "Prediction of Polar Ordered Oxynitride Perovskites," Appl. Phys. Lett. 91, 092902 (Aug. 2007).

*Primary Examiner* — Jerry Lorengo
*Assistant Examiner* — Lynne Edmondson
(74) *Attorney, Agent, or Firm* — Fitzpatrick, Cella, Harper & Scinto

(57) ABSTRACT

An oxynitride piezoelectric material, which exhibits ferroelectricity and has good piezoelectric properties, and a method of producing the oxynitride piezoelectric material. The oxynitride piezoelectric material includes a tetragonal perovskite-type oxynitride represented by the following general formula (1):

$$A_{1-x}Bi_{x+\delta 1}B_{1-y}B'_{y+\delta 2}O_{3-z}N_z \qquad (1),$$

where A represents a divalent element, B and B' each represent a tetravalent element, x represents a numerical value of 0.35 or more to 0.6 or less, y represents a numerical value of 0.35 or more to 0.6 or less, z represents a numerical value of 0.35 or more to 0.6 or less, and $\delta 1$ and $\delta 2$ each represent a numerical value of −0.2 or more to 0.2 or less, in which the A includes at least one kind selected from Ba, Sr, and Ca and the B and the B' each include at least one kind selected from Ti, Zr, Hf, Si, Ge, and Sn.

8 Claims, 4 Drawing Sheets

U.S. PATENT DOCUMENTS

| | | |
|---|---|---|
| 7,090,785 B2 * | 8/2006 | Chiang et al. ............ 252/62.9 R |
| 7,525,239 B2 | 4/2009 | Aoki et al. |
| 2006/0045840 A1 | 3/2006 | Chen et al. |
| 2006/0172880 A1 | 8/2006 | Shirakawa et al. |
| 2009/0315432 A1 | 12/2009 | Furuta et al. |
| 2010/0025617 A1 | 2/2010 | Kubota et al. |
| 2010/0025618 A1 | 2/2010 | Watanabe et al. |
| 2010/0081559 A1 | 4/2010 | Zhang et al. |
| 2010/0155646 A1 * | 6/2010 | Furuta et al. ........... 252/62.9 PZ |

* cited by examiner

FIG. 5A
FIG. 5B
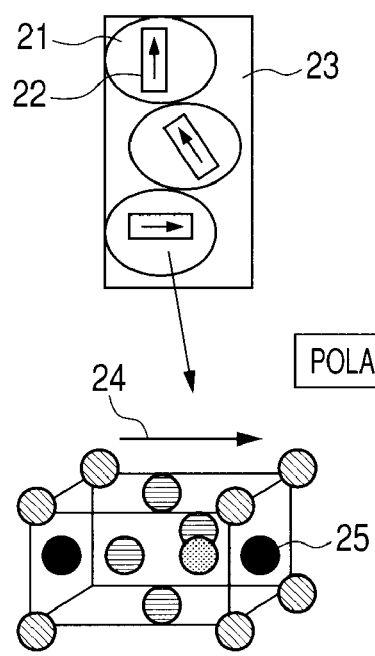
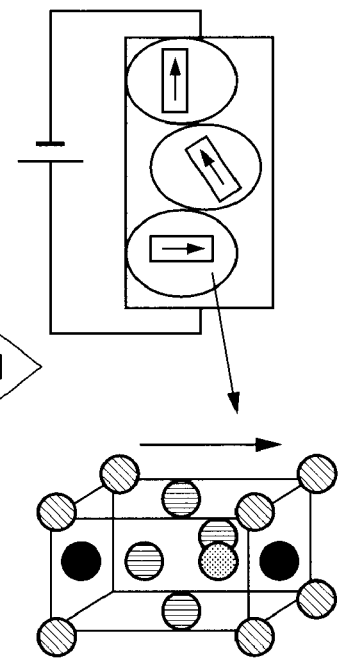
POLARIZATION
FIG. 6A
FIG. 6B
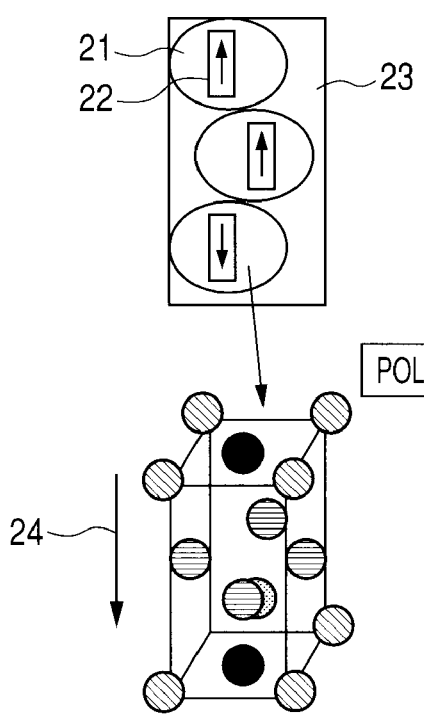
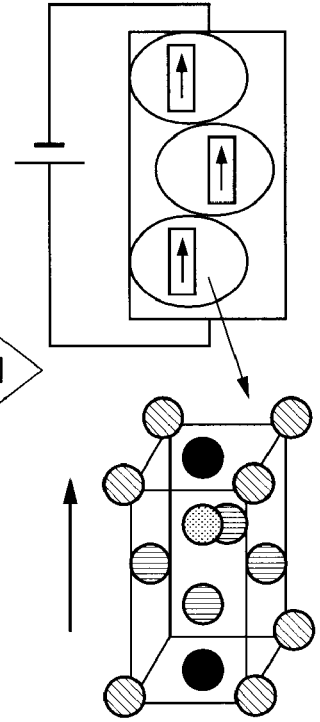
POLARIZATION

OXYNITRIDE PIEZOELECTRIC MATERIAL AND METHOD OF PRODUCING THE SAME

BACKGROUND OF THE INVENTION

1. Field of the Invention

The present invention relates to an oxynitride piezoelectric material and a method of producing the oxynitride piezoelectric material, and more particularly to a piezoelectric material free of lead. Further, the present invention relates to a piezoelectric material including a perovskite-type oxynitride.

2. Description of the Related Art

Piezoelectric materials are widely used for applications, such as an actuator, an ultrasonic transducer, a micro-current source, and a generator of high piezoelectricity. Many of the piezoelectric materials used for those applications are each a material that is referred to as a so-called PZT, which is an oxide containing lead (Pb), zirconium (Zr), and titanium (Ti). Therefore, in view of environmental problems, a lead-free oxide piezoelectric material is being developed.

For example, as a lead-free oxide, barium titanate (BaTiO$_3$) is known. However, barium titanate has a low Curie point of 120° C., and the piezoelectric properties thereof are eliminated at a temperature higher than 120° C. Accordingly, barium titanate is impractical when considering the applications in which the material containing barium titanate is exposed to high temperature, e.g., in a bonding step using solder or the like, and for in-vehicle use. In this way, because barium titanate has a low Curie point, the use of a lead-free oxide as an alternative to a lead oxide has not yet been achieved.

On the other hand, it is known that perovskite-type oxides include oxynitrides in addition to oxides. As illustrated in FIG. 1, YSiO$_2$N and YGeO$_2$N are being studied as oxynitrides in which N atoms are present in a state oriented in a c-axis direction (R. Caracas et al., Applied Physics Letters, Vol. 91, 092902 (2007)). According to the study, it has been revealed that high piezoelectric properties can be expected due to the ferroelectricity exhibited by N atoms oriented in the c-axis direction.

Further, in general, a piezoelectric material having a c-axis length longer than an a-axis length tends to have a higher Curie temperature. A ratio c/a (ratio of a c-axis length to an a-axis length in a unit cell) of YSiO$_2$N is 1.37 and a ratio c/a of YGeO$_2$N is 1.41, which are large (for example, a ratio c/a of BaTiO$_3$ is about 1.01). Hence, the Curie points of YSiO$_2$N and YGeO$_2$N are expected to be high. In this manner, the oxynitrides have a potential to be used as a promising piezoelectric material.

However, a material in which the ratio c/a is too large has an unstable structure. Hence, this material is known to be difficult to produce. For example, BiCoO$_3$ having a ratio c/a of 1.27 can only be produced under ultrahigh pressure and high temperature conditions. Furthermore, YSiO$_2$N and YGeO$_2$N each have a ratio c/a of far greater than 1.27. Therefore, they are extremely difficult to produce. There has been no example of the materials that were actually produced.

The present invention has been achieved in view of the above-mentioned problems, and provides a novel oxynitride piezoelectric material, which exhibits ferroelectricity and has good piezoelectric properties. It also provides a method of producing the oxynitride piezoelectric material.

SUMMARY OF THE INVENTION

An oxynitride piezoelectric material for solving the above-mentioned problems includes a tetragonal perovskite-type oxynitride represented by the following general formula (1), in which N atoms are oriented in a c-axis direction:

$$A_{1-x}Bi_{x+\delta1}B_{1-y}B'_{y+\delta2}O_{3-z}N_z \qquad (1),$$

where A represents a divalent element, B and B' each represent a tetravalent element, x represents a numerical value of 0.35 or more to 0.6 or less, y represents a numerical value of 0.35 or more to 0.6 or less, z represents a numerical value of 0.35 or more to 0.6 or less, and δ1 and δ2 each represent a numerical value of −0.2 or more to 0.2 or less.

Further, a method of producing an oxynitride piezoelectric material for solving the above-mentioned problems is a method of producing an oxynitride piezoelectric material represented by the above general formula (1), the oxynitride piezoelectric material containing, as a part of raw materials, shape anisotropic particles containing at least A and Bi, including: orienting the shape anisotropic particles; and sintering the shape anisotropic particles in an atmosphere containing nitrogen atoms.

According to the present invention, there can be provided a novel oxynitride piezoelectric material, which exhibits ferroelectricity and has good piezoelectric properties and a method of producing the oxynitride piezoelectric material.

Further features of the present invention will become apparent from the following description of exemplary embodiments with reference to the attached drawings.

BRIEF DESCRIPTION OF THE DRAWINGS

FIGS. 5A and 5B are diagrams illustrating a polarization treatment of a non-oriented oxynitride piezoelectric material.

FIGS. 6A and 6B are diagrams illustrating a polarization treatment of an oxynitride piezoelectric material having an orientation axis.

DESCRIPTION OF THE EMBODIMENTS

Figure 1:
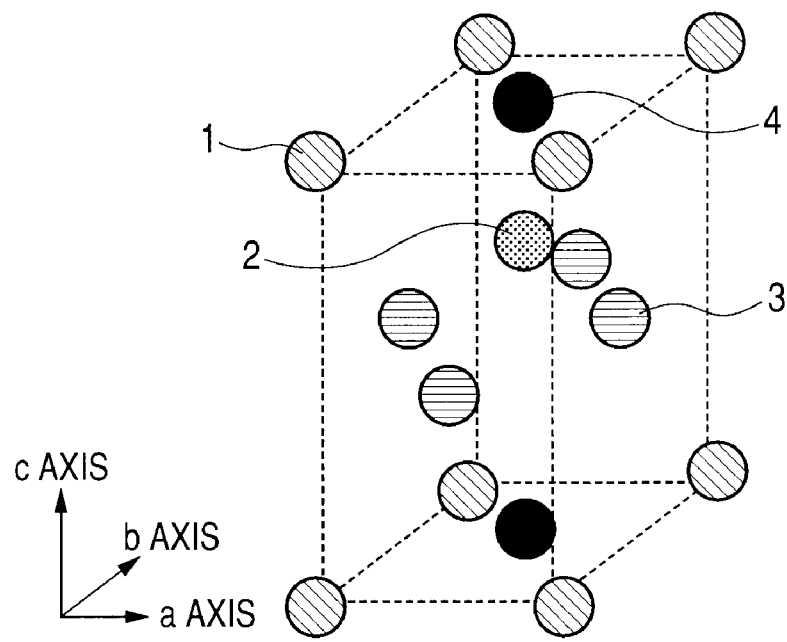
FIG. 1 is a diagram illustrating a unit cell of an oxynitride having an Nc structure.

Preferred embodiments of the present invention will now be described in detail in accordance with the accompanying drawings.

An oxynitride piezoelectric material according to the present invention includes a tetragonal perovskite-type oxynitride represented by the following general formula (1), in which N atoms are oriented in a c-axis direction.

$$A_{1-x}Bi_{x+\delta1}B_{1-y}B'_{y+\delta2}O_{3-z}N_z \qquad (1),$$

In the general formula (1), A represents a divalent element, B and B' each represent a tetravalent element, x represents a numerical value of 0.35 or more to 0.6 or less, y represents a numerical value of 0.35 or more to 0.6 or less, z represents a numerical value of 0.35 or more to 0.6 or less, and δ1 and δ2 each represent a numerical value of −0.2 or more to 0.2 or less.

In the general formula (1), A represents an element occupying an A site, the A site being formed of A together with Bi, and B and B' each represent an element occupying a B site.

The oxynitride piezoelectric material does not largely influence the piezoelectric properties, but a deviation in the composition easily occurs during the course of producing the material. Hence, x, y, and z are not equal to each other, and δ is not 0. In addition, there is a tendency for x, y, and z to satisfy the following relationship: x≧y>z, more desirably x=y, and still more desirably x=y=z. The reason why z is smaller than x and y is that the nitrogen atoms are difficult to introduce into the oxynitride piezoelectric material and oxygen is incorporated thereinto instead. In the oxynitride piezoelectric material of the present invention, the values of x and y can be determined independently, each in such a range that the material exhibits good piezoelectric properties. The ranges of the values of x and y that allow the material to exhibit good piezoelectric properties are found to be as follows: the value of x is in the range of 0.35 or more to 0.6 or less; and the value of y is in the range of 0.35 or more to 0.6 or less, which is the same as in the case of x. The range that the value of y may fall in can be determined in accordance with the range that the value of x may fall in. Therefore, the range of values of x in the description below mainly falls in the that mentioned above.

In the above composition ratio, the value of a ratio c/a exceeds 1.0, and hence, the oxynitride expresses ferroelectricity and becomes a piezoelectric material.

Examples of A in the general formula (1) include Ca, Sr, Ba, and Pb, which are divalent elements. A is preferably Ba, Sr, and Ca, and is more preferably Ba.

Examples of B and B' include Ti, Zr, Hf, Si, Ge, Sn, and C. Further, examples of B and B' include, in the case of the composition ratio of $B1_{1/4}B5_{3/4}$: Li and Cu as B1; and Nb, Sb, and Ta as B5. Still further, examples of B and B' include, in the case of the composition ratio of $B3_{2/3}B6_{1/3}$: Mn, Sb, Al, Yb, In, Fe, Co, Sc, Y, and Sn as B3; and W, Te, and Re as B6. Still further, examples of B and B' include, in the case of the composition ratio of $B2_{1/2}B6_{1/2}$: Mg, Ni, Zn, Co, Sn, Fe, Cd, Cu, and Cr as B2; and W, Te, and Re as B6. Still further, examples of B and B' include, in the case of the composition ratio of $B3_{1/2}B5_{1/2}$: Mn, Sb, Al, Yb, In, Fe, Co, Sc, Y, and Sn as B3; and Nb, Sb, and Ta as B5. Still further, examples of B and B' include, in the case of the composition ratio of $B2_{1/3}B5_{2/3}$: Mg, Ni, Zn, Co, Sn, Fe, Cd, Cu, and Cr as B2; and Nb, Sb, and Ta as B5. Of those, desired as B or B' are Ti, Zr, Hf, Si, Ge, and Sn. More desired as B is Ti, and as B' are Si, Ge, and Sn. Further details are described in Embodiment 1 below.

In addition, the oxynitride piezoelectric material according to the present invention may have an orientation (i.e., a state in which crystal planes of a large number of crystal grains that form the piezoelectric material are oriented in a specific direction) for forming a piezoelectric material.

An orientation axis is expressed by using Miller indices. The orientation axis in the case of having an orientation is desirably <100>, <110>, or <111>.

When the oxynitride piezoelectric material has an orientation, the degree of the orientation is expressed by an average degree of orientation F(HKL) using the Lotgering method, which is represented by the following Equation (1).

$F(HKL) = \{(P-P0)/(1-P0)\} \times 100 (\%)$    Equation (1)

Provided that: $P = \Sigma I(HKL)/\Sigma I(hkl)$; and $P0 = \Sigma I0(HKL)/\Sigma I0(hkl)$.

It should be noted that, in the Equation (1), ΣI(hkl) is a total sum of X-ray diffraction intensities of all crystal planes (hkl) measured in oriented ceramics of an oxynitride.

ΣI0(hkl) is a total sum of X-ray diffraction intensities of all crystal planes (hkl) measured in non-oriented ceramics of an oxynitride having the same composition as the oriented ceramics of an oxynitride.

Further, ΣI(HKL) is a total sum of X-ray diffraction intensities of specific crystal planes (HKL), which are crystallographically equivalent with each other, measured in oriented ceramics of an oxynitride.

ΣI0(HKL) is a total sum of X-ray diffraction intensities of specific crystal planes (HKL), which are crystallographically equivalent with each other, measured in non-oriented ceramics of an oxynitride having the same composition as the oriented ceramics of an oxynitride.

Further, in the case of determining a degree of orientation of [100], a plane equivalent to the plane (100) was used as the plane (HKL). Further, an X-ray diffraction pattern was measured by using Cu—Kα radiation. Used for the calculation were peaks each in which 2θ was in the range of 5° to 72°.

Accordingly, in the case where crystal grains are non-oriented, the average degree of orientation F(HKL) becomes 0%. Further, in the case where the planes (HKL) of all the crystal grains are oriented in parallel with respect to the measuring plane, the average degree of orientation F(HKL) becomes 100%.

As the ratio of crystal grains that are oriented in a specific direction becomes larger, higher piezoelectric properties can be obtained. As a specific degree of the orientation, in order to obtain high piezoelectric properties, the average degree of orientation F(HKL) expressed in the equation (1) is desirably 10% or more, more desirably 50% or more, and still more desirably 90% or more.

Further, in the ceramics, as the relative density, i.e., the ratio of the density of the ceramics to the theoretical density of the ceramics, becomes larger, higher piezoelectric properties and higher mechanical properties can be obtained. The relative density is desirably 80% or more, more preferably 90% or more, and still more desirably 95% or more. Further details are described in Embodiment 2 below.

A method of producing an oxynitride piezoelectric material according to the present invention is a method of producing an oxynitride piezoelectric material represented by the following general formula (1), the oxynitride piezoelectric material using, as a raw material, shape anisotropic particles containing at least A and Bi, including: orienting the shape anisotropic particles; and sintering the shape anisotropic particles in an atmosphere containing nitrogen atoms.

Further, a method of producing an oxynitride piezoelectric material according to the present invention is a method of producing an oxynitride piezoelectric material represented by the following general formula (1), the oxynitride piezoelectric material using, as raw materials, shape anisotropic particles containing A and Bi and an oxynitride containing B and B', including orienting the shape anisotropic particles.

$A_{1-x}Bi_{x+\delta 1}B_{1-y}B'_{y+\delta 2}O_{3-z}N_z$    (1), where A represents a divalent element, B and B' each represent a tetravalent element, x represents a numerical value of 0.35 or more to 0.6 or less, y represents a numerical value of 0.35 or more to 0.6 or less, z represents a numerical value of 0.35 or more to 0.6 or less, and δ1 and δ2 each represent a numerical value of −0.2 or more to 0.2 or less.

In the above process, it is preferred that the shape anisotropic particles be formed into a slurry by using a binder and the shape anisotropic particles be oriented by being subjected to tape casting.

In the above process, the shape anisotropic particles are preferably oriented by being sintered while being uniaxially pressurized.

Embodiment 1

Embodiment 1 describes a piezoelectric material that is an oxynitride formed of A, B, and B', which represent Ba, Ti, and Si, respectively, and satisfies the relationship x=y in the general formula (1).

In this embodiment, $Ba_{1-xBix}Ti_{1-x}Si_xO_{3-x}N_x$ is described as an example.

This embodiment is based on the simulation results obtained by the electronic state calculation called a "first principle calculation". First, an outline of the simulation on the electronic state calculation is described below. The "first principle calculation" is a collective term of electronic state calculation techniques without any fitting parameter being used. In such a technique, the electronic state calculation can be performed by simply inputting an atomic number and a coordinate of each atom of which a unit cell, a molecule, and the like are formed.

Further, the electronic state calculation of a system containing atoms at any composition ratio may be performed in a relatively simple and highly accurate manner by using a technique called "Coherent Potential Approximation (CPA)".

One of the electronic state calculation techniques using CPA is a calculation technique called "Korringa-Kohn-Rostoker Coherent Potential Approximation (KKR-CPA) method". One of programs of the KKR-CPA method is a program called "MACHIKANEYAMA 2002" (H & M. Akai, Korringa-Kohn-Rostoker Coherent Potential Approximation Package (H. Akai, Osaka University, 2000)), which has been developed by Prof. Hisazumi Akai, Osaka University.

All of the results by the electronic state calculation of $Ba_{1-xBix}Ti_{1-x}Si_xO_{3-x}N_x$ as described in this embodiment are obtained by using "MACHIKANEYAMA 2002".

It should be noted that the crystal structure of each of $BaTiO_3$, in which x in $Ba_{1-xBix}Ti_{1-x}Si_xO_{3-x}N_x$ represents 0, and $BiSiO_2N$, in which x in $Ba_{1-xBix}Ti_{1-x}Si_xO_{3-x}N_x$ represents 1, has been separately determined in advance by the calculation using a first principle calculation package program called "ABINIT". "ABINIT" is a package program that is also capable of performing a structure optimization, which has been developed mainly by Prof. X. Gonze, Cornell University.

Next, a calculation method for the total energy of an oxynitride using "MACHIKANEYAMA 2002", and a correlation between the most stable structure and an element of which the oxynitride is formed, are each described below with reference to the figures.

There are two structures for a perovskite-type oxynitride of an $ABX_3$-type.

One structure is a structure in a unit cell of the perovskite-type oxynitride as illustrated in FIG. 1 in which nitrogen atoms are coordinated in a c-axis direction of a crystal. In FIG. 1, an A atom, which occupies an A site of an $ABX_3$-type perovskite structure, is represented by 1, a B atom, which occupies a B site, is represented by 2, an oxygen atom is represented by 3, and a nitrogen atom is represented by 4.

The A atoms 1 form eight vertices of the unit cell, and the oxygen atoms 3 and the nitrogen atoms 4 (hereinafter may be referred to as N atoms) are involved inside the unit cell. In addition, the N atoms 4 are coordinated to planes ("top plane" and "bottom plane" of the unit cell in FIG. 1) each intersecting the C-axis of the crystal.

Figure 2:
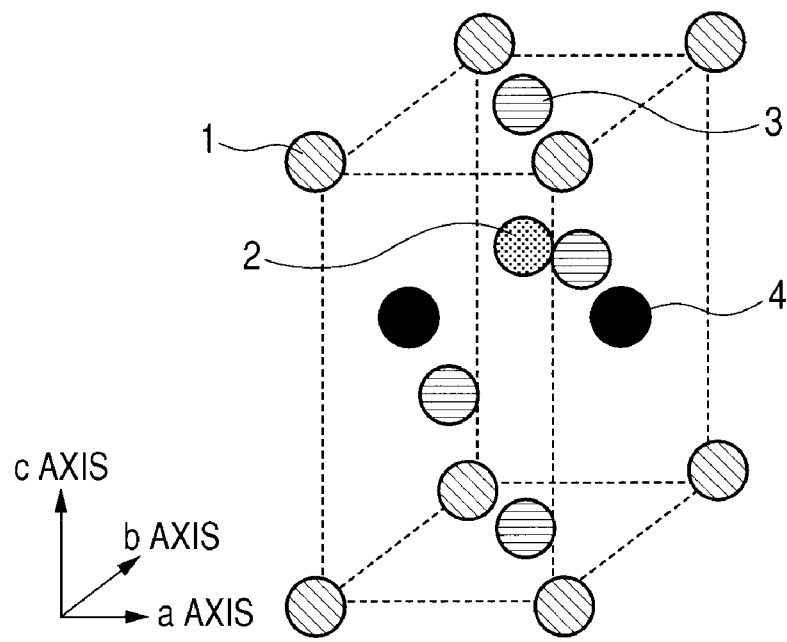
FIG. 2 is a diagram illustrating a unit cell of an oxynitride having an Nab structure.

The other structure is a structure as illustrated in FIG. 2 in which each of the N atoms 4 is coordinated into an ab plane.

There are two structures as mentioned above for the perovskite-type oxynitride of an $ABX_3$-type: a structure (referred to as Nc structure) in which each of the N atoms 4 is oriented in the c-axis direction; and a structure (referred to as Nab structure) as illustrated in FIG. 2 in which each of the N atoms 4 is present in the ab plane. It should be noted that, in FIG. 2, the same reference numerals as those in FIG. 1 represent the same components, respectively.

As illustrated in FIG. 1, an atom present in an A site of an oxynitride $ABO_2N$ is called "A atom", and an atom present in a B site is called "B atom". In order to determine a stable structure, the electronic state calculation may be performed by selecting proper elements as the A atom and the B atom and preparing each of the Nc structure and the Nab structure as an initial structure. The total energy in the stable structure determined by such electronic state calculation was defined as E_Nc and E_Nab, respectively. In conclusion, one structure having smaller total energy is the most stable structure, and the other structure is a metastable structure.

It should be understood that which of the Nc structure and the Nab structure becomes the most stable structure depends on the kind of elements to be selected. However, an index representing a relationship between elements of which the A atom and the B atom are formed and the most stable structure thus far has never been clearly presented. The inventors of the present invention have intensively studied a correlation between the most stable structure of the oxynitride $ABO_2N$ and the elements. As a result, the inventors have found that the Nc structure becomes the most stable structure when the following two conditions are satisfied.

A first condition is that a ratio c/a of the c-axis length c to the a-axis length a is large in a unit cell. The condition is required for the purpose of preventing the interference of electronic states between an A atom plane (in FIG. 1, a plane: including four A atoms of which the top plane of the unit cell is formed; and intersecting the C-axis) and a B atom plane (a plane: including both a B atom in FIG. 1 and a B atom in the adjacent unit cell; and intersecting the C-axis).

When the ratio c/a is small, the interference of electronic states occurs between the A atom plane and the B atom plane of the oxynitride $ABO_2N$. Hence, a charge neutralizing effect as a second condition mentioned below may be reduced.

The second condition is that a trivalent atom and a tetravalent atom are selected as the A atom and the B atom of the oxynitride $ABO_2N$, respectively.

This is because, when N atoms 4 are present with being oriented in the c-axis direction as illustrated in FIG. 1, a charge in the A atom plane is neutralized. As a result, the N atoms 4 are preferentially coordinated to the top plane position of the unit cell, that is, c-axis direction. Meanwhile, when an O atom is present in the B atom plane, a charge is neutralized. Therefore, the O atom is preferentially present in the B atom plane.

In view of the above-mentioned two conditions, Bi as a trivalent element and Si were selected as the A atom and the B atom of the oxynitride $ABO_2N$, respectively. The reason is as follows: Bi is a trivalent atom and a Bi-based oxide is high in anisotropy. Hence, the ratio c/a should be large. In $BiSiO_2N$, the electronic state calculation validated that the Nc structure is the most stable structure.

Table 1 shows a relationship between x in $Ba_{1-x}Bi_x Ti_{1-x}Si_xO_{3-x}N_x$ and $\Delta E = E\_Nab - E\_Nc$.

Further, $Ba_{1-xBix}Ti_{1-x}Si_xO_{3-x}N_x$ is regarded to be equivalent to a piezoelectric material obtained by forming a solid solution of $BaTiO_2$ and $BiSiO_2N$. It should be noted that, in the piezoelectric material, a part of trivalent Bi elements is replaced by divalent Ba elements.

$\Delta E$ in Table 1 represents a difference obtained by subtracting a value of E_Nc from a value of E_Nab. When the number is positive, the Nc structure is the most stable structure, and when the number is negative, the Nab structure is the most stable structure.

TABLE 1

| x | ΔE = E_Nab − E_Nc | a-axis length (nm) | c-axis length (nm) | Ratio c/a |
|---|---|---|---|---|
| 0 |  | 0.3992 | 0.4036 | 1.01102 |
| 0.1 | −0.0015 | 0.393 | 0.41284 | 1.05048 |
| 0.2 | −0.0029 | 0.3868 | 0.42208 | 1.09121 |
| 0.3 | −0.0013 | 0.3806 | 0.43132 | 1.13326 |
| 0.4 | 0.0018 | 0.3744 | 0.44056 | 1.17671 |
| 0.5 | 0.0303 | 0.3682 | 0.4498 | 1.22162 |
| 0.6 | 0.0196 | 0.362 | 0.45904 | 1.26807 |
| 0.7 | 0.0516 | 0.3558 | 0.46828 | 1.31613 |
| 1 | 0.0825 | 0.3372 | 0.496 | 1.47094 |

In the case where x in $Ba_{1−xBix}Ti_{1−x}Si_xO_{3−x}N_x$ represents 1, i.e., $BiSiO_2N$, the structure thereof was determined by conducting the electronic state calculation involving structure optimization. ΔE of $BiSiO_2N$ shows a positive value. Hence, the Nc structure is the most stable structure. Further, the crystal structure of $BiSiO_2N$ is a tetragonal system. In this case, the ratio c/a is as extremely large as 1.471. Thus, it is difficult to produce $BiSiO_2N$.

The preferred range of the ratio c/a is 1.269 or less as mentioned above. This is because $BiCoO_3$ having a ratio c/a of 1.27 may be produced only at ultrahigh pressure and temperature conditions. Hence, the ratio c/a exceeding 1.27 makes the production difficult.

The formation of a solid solution of $BiSiO_2N$ and $BaTiO_3$ can lead to a decrease in the ratio c/a.

However, when the ratio c/a is too small, a distance between the A atom plane and the B atom plane becomes small, which causes the interference of electronic states. As a result, the above-mentioned first condition is not satisfied, and the Nab structure may be the most stable structure in place of the Nc structure.

Thus, a lower limit of the critical point of the ratio c/a at which the Nc structure becomes the most stable structure was investigated as follows. The a-axis length, c-axis length, and displacement in each of atoms of $Ba_{1−xBix}Ti_{1−x}Si_xO_{3−x}N_x$ were determined by applying Vegard's Law to $BiSiO_2N$ and $BaTiO_3$. For the a-axis length, c-axis length, and displacement in each of atoms, all of which were determined using Vegard's Law, the electronic state calculation was performed to determine ΔE=E_Nab−E_Nc. Table 1 shows the results.

In Table 1, the sign of ΔE switches from plus to minus in x of 0.3 to 0.4. That is, when x represents 0.4 or more, the Nc structure is the most stable, and when x represents 0.3 or less, the Nab structure is the most stable. Therefore, the critical point is present in x of 0.3 to 0.4. Then, the interpolation of the results in Table 1 revealed that the critical point was x=0.35. In this case, the ratio c/a is 1.15.

From the foregoing, the desired range of the ratio c/a is 1.15 or more to 1.269 or less, and the desired range of x is 0.35 or more to 0.6 or less.

Further, the oxynitride includes a tetragonal system, and nitrogen atoms contained in the oxynitride are preferably oriented in the c-axis direction.

When x represents 0.5, the electronic state calculation involving structure optimization was performed to determine a piezoelectric constant. As a result, the piezoelectric constant d33 is 73.53 (pC/N), and the presence of piezoelectric properties was confirmed.

An oxynitride having a construction of Embodiment 1 may be produced, for example, as a powder and a thin film as described below.

In the case of a powder, $Ba_{0.6}Bi_{0.4}Ti_{0.6}Si_{0.4}O_{2.6}N_{0.4}$ may be produced as follows. $BaCO_3$ (manufactured by Kojundo Chemical Lab. Co., Ltd., 99.99%), $TiO_2$ (manufactured by Kojundo Chemical Lab. Co., Ltd., 99.99%), $Bi_2O_3$ (manufactured by Kojundo Chemical Lab. Co., Ltd., 99.999%), and $SiO_2$ (manufactured by Kojundo Chemical Lab. Co., Ltd., 99.999%) are added to an ethanol solution at a molar ratio 3:3:1:2 and mixed with a planetary ball mill for 1 hour. Bi may be deficient because of its high vapor pressure. Hence, an excess amount of Bi compared with the above-mentioned molar ratio is desirably added.

Figure 3:
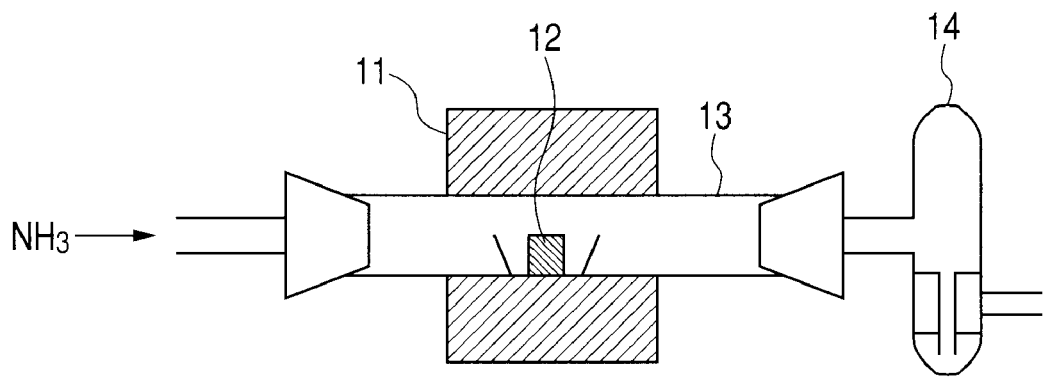
FIG. 3 is a diagram illustrating a tubular atmosphere furnace.

After sufficient drying, the mixture is calcined with a tubular atmosphere furnace as illustrated in FIG. 3 in a dry ammonia gas (99.99%, flow rate: 0.5 cm³/s) atmosphere. In FIG. 3, an electric furnace is represented by 11, an oxynitride is represented by 12, a quartz tube is represented by 13, and a trap is represented by 14. The calcination is performed under the following conditions: heating temperature: 900° C. to 1,000° C.; heating time: 80 hours; temperature rising rate: 5° C./min; and temperature falling rate: 10° C./min. The calcined powder is added to an ethanol solution and milled with a planetary ball mill for 1 hour.

A preferred production method involves not only the use of an ammonia gas atmosphere as a nitrogen source, but also the use of SiN and TiN as raw materials.

Meanwhile, in the case of a thin film, the film can be easily formed by using a known method, such as a sputtering method, a sol-gel method, a laser ablation method, and a CVD method. Preferably, a sputtering method is used. For example, when a film is formed with a sputtering apparatus, metal holders for Bi, Ba, Ti, and Si are prepared in a chamber into which an $N_2$ gas, an $O_2$ gas, and an Ar gas flowed, and an Ar beam as an ion source is irradiated on those holders. A film formation condition is set so as to achieve a desired element composition, and each of the metals sputtered by the Ar beam is allowed to fly on a substrate equipped in the chamber, to thereby form a target $Ba_{0.6}Bi_{0.4}Ti_{0.6}Si_{0.4}O_{2.6}N_{0.4}$ piezoelectric material thin film.

Embodiment 2

In Embodiment 2, an oxynitride having an orientation axis is described.

Figure 4A:
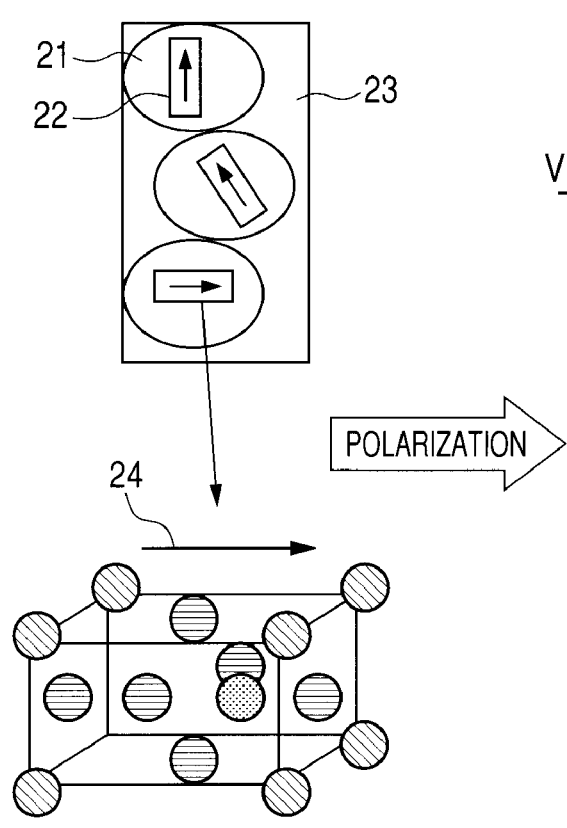
FIGS. 4A and 4B are diagrams illustrating a polarization treatment of a conventional oxide piezoelectric material.
Figure 4B:
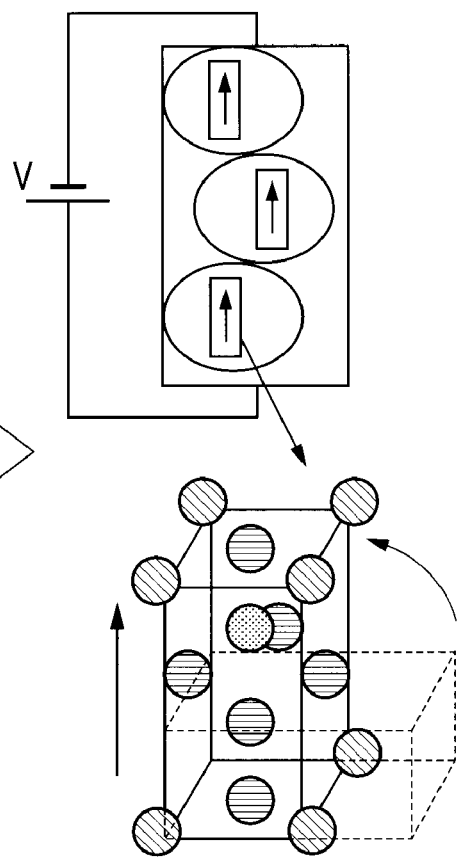

A conventional oxide piezoelectric material has been produced by mixing a raw material powder and sintering the mixture at high temperatures. Therefore, as illustrated in FIG. 4A, the oxide piezoelectric material has no orientation axis immediately after sintering, and individual crystal grains each have a random polarization axis direction. In FIG. 4A, a grain is represented by 21, a unit cell is represented by 22, a ceramic is represented by 23, and a polarization axis is represented by 24. It should be noted that in the figures as illustrated below, the same reference numerals represent the same components as those in FIG. 4A. A voltage is applied to both sides of a sintered article of the oxide to align the polarization axes. The treatment is called a "polarization treatment". When the polarization axes are aligned in one direction, piezoelectric properties are enhanced. As illustrated in FIG. 4B, when general oxides are subjected to the polarization treatment, the c-axis is rotated in an electric field direction. Therefore, even when the piezoelectric material obtained by sintering has a random polarization axis direction, polarization axes can be aligned in one direction to some extent.

Meanwhile, as illustrated in FIG. 5A, in an oxynitride having a random polarization axis direction, it is known that polarization axes are difficult to align in one direction even when the polarization treatment is performed. This is because, as illustrated in FIG. 5B, the polarization treatment causes no change in position of nitrogen atoms 25, and the c-axis is not rotated in an electric field direction. Therefore, the sintered article of the oxynitride hardly exhibits sufficient piezoelectric properties.

Thus, the inventors of the present invention have investigated that, as illustrated in FIGS. 6A and 6B, a polarization axis direction is aligned by: producing an oxynitride having an aligned polarization axis direction, that is, as illustrated in FIG. 6A, aligned orientation axis direction, during oxynitride production with sintering; and subjecting the oxynitride to the polarization treatment. Therefore, there is provided an effect that the oxynitride having an orientation axis has higher piezoelectric properties compared with a non-oriented oxynitride.

Next, a production method for such an oxynitride piezoelectric material having an orientation axis in a specific direction as mentioned above is described with reference to FIG. 7.

First, raw materials for the oxynitride piezoelectric material are described. Shape anisotropic particles 31 and isotropic matrix particles 32 were used as the raw materials.

The shape anisotropic particles 31 refer to particles each having an anisotropic shape, such as a plate, a whisker, and a rod. The plate-like particles each have an aspect ratio of 3 or more to 20 or less. The whisker-like particles and rod-like particles each have a ratio of the major axis to the minor axis of 5 or more to 100 or less. Compounds other than the $ABX_3$-type perovskite compound may be used for those shape anisotropic particles. For example, a Bi layered compound, TiNO, and SiNO may be used, and preferred is a compound that is an $ABX_3$-type perovskite compound and a Bi layered compound.

Preferred are particles each having a shape that can be easily oriented in a certain direction during such a molding step as mentioned below.

In contrast, the matrix particles each have an isotropic shape, such as a spherical shape. In order to enhance ceramic density, it is desirable for each of the matrix particles to have a smaller average particle diameter than the shape anisotropic particles.

The shape anisotropic particles and the matrix particles are particles of any one of a nitride, an oxynitride, and an oxide. The nitride and the oxynitride are obtained by nitriding the oxide.

The nitriding refers to heating raw materials in a nitrogen atmosphere or an ammonia atmosphere at an appropriate heating temperature that is higher than a temperature at which the raw materials and nitrogen are reacted with each other, and is lower than a grain growth temperature. Of those, an ammonia atmosphere is desired because the satisfactory reactivity of ammonia may prevent the grain growth at lower heating temperatures. Further, by using the nitride as one of the raw materials, nitrogen atoms contained in the raw materials are involved under heating calcination and introduced into an X site of an $ABX_3$-type compound.

The composition of those shape anisotropic particles and matrix particles is determined so as to achieve a desired oxynitride composition, and both particles are mixed and calcinated.

Next, a production process for the oxynitride piezoelectric material is described. The production process includes a mixing step, a molding step, and a sintering step.

Mixing Step

First, a mixing step is described. The mixing step refers to a step of mixing shape anisotropic particles and matrix particles. In the mixing step, one kind of shape anisotropic particles may be used, or two or more kinds thereof may be used in combination.

Further, in the mixing step, to the shape anisotropic particles and matrix particles formulated at a predetermined proportion, a sintering aid, such as CuO and $MnO_2$, may be further added. The addition of the sintering aid to starting raw materials provides an advantage in that a sintered article is further easily densified.

Further, during mixing the shape anisotropic particles and the matrix particles, when the compounding proportion of the shape anisotropic particles is too small, a sintered article oriented in a specific direction may be hardly obtained, resulting in a reduction in degree of orientation. Therefore, an optimum proportion is preferably selected for the compounding proportion of the shape anisotropic particles, depending on the required sintered article density and degree of orientation.

In addition, the shape anisotropic particles, the matrix particles, and a sintering aid, which is formulated as appropriate, may be dry-mixed or may be wet-mixed by adding an appropriate dispersion medium, such as water and an alcohol. In addition, at this time, a binder and/or a plasticizer may be added as appropriate.

Molding Step

Second, a molding step is described. The molding step refers to a step involving: aligning shape anisotropic particles in the mixture obtained in the mixing step in a specific direction; and orienting shape anisotropic particles so that a sintered article would be oriented in a specific direction based on a crystal plane of shape anisotropic particles in a sintering step, which is the next step.

Figure 7:
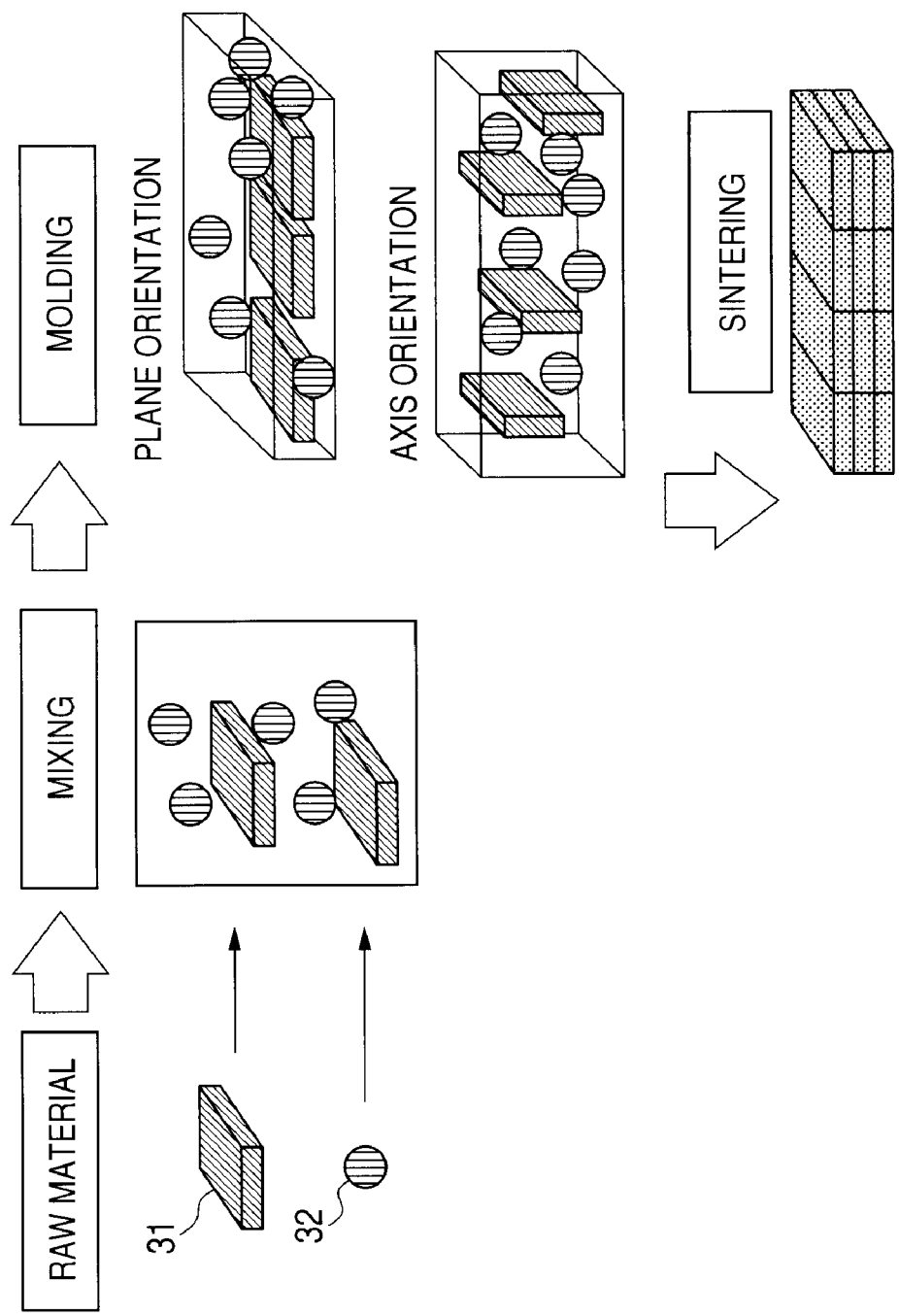
FIG. 7 is a diagram illustrating a production process of an oxynitride piezoelectric material having an orientation axis.

In this case, molding may be performed so that shape anisotropic particles would be oriented with plane orientation as illustrated in FIG. 7. Alternatively, molding may be performed so that shape anisotropic particles would be oriented with axis orientation as illustrated in FIG. 7. Any molding method may be used, as long as it allows shape anisotropic particles to be arranged and oriented in a specific direction, and is not particularly limited. For the molding method, which allows the plane orientation of the shape anisotropic particles, one of a doctor blade method, a pressure molding method, and a rolling method is specifically exemplified as being suitable.

Further, as a suitable specific example of a molding method that allows the axis orientation of the shape anisotropic particles, there is given one of an extrusion molding method and a centrifugal molding method.

Further, in order to further enhance the degree of orientation of a sintered article to be obtained after sintering, the molded article in which shape anisotropic particles each had a plane orientation may be further subjected to a treatment, such as stacking and pressure bonding, pressing, and rolling. The molded article may be subjected to any one kind of treatment, or may be subjected to two or more kinds of treatments.

Further, the molded article may be repeatedly subjected to one kind of treatment several times. Alternatively, each of two or more kinds of treatments may be performed several times.

Sintering Step

Finally, the sintering step is described. The sintering step is a step involving heating and sintering the molded article obtained in the molding step.

When the molded article containing shape anisotropic particles and matrix particles is heated to a predetermined temperature, an oxynitride crystal is generated and grows according to a crystal plane of shape anisotropic particles, and sintering of ceramics proceeds. The predetermined temperature is preferably 700° C. to 1,600° C.

An optimum heating temperature may be selected so that the crystal growth and/or sintering would efficiently proceed and a compound having a target composition would be generated. The optimum temperature may be specified in the range of 700° C. to 1,600° C.

Further, heating may be performed in any atmosphere, such as in nitrogen, in a mixed gas formed of oxygen and nitrogen, and in ammonia. Heating may be performed preferably in nitrogen and in ammonia, because the deletion of nitrogen may be reduced.

In addition, an optimum heating time may be selected depending on the heating temperature so as to provide a predetermined sintered article density.

For a heating method, there may be employed any of a normal pressure sintering method and a pressure sintering method, such as a uniaxial pressure sintering method, hot pressing, hot forging, and HIP. An optimum method may be selected depending on, for example, the composition and application. Preferably, uniaxial pressure sintering may be performed to further enhance the degree of orientation.

It should be noted that in the case of the molded article containing a binder, thermal treatment primarily intended for degreasing may be performed before the sintering step. In this case, the degreasing temperature may be any temperature as long as the temperature is sufficient for thermally degrading at least the binder. A temperature of 300° C. to 600° C. is preferred. It should be noted that when a volatile product, such as an Na compound, is contained in the raw materials, degreasing is preferably performed at 500° C. or lower.

Hereinafter, the present invention is specifically described by way of examples.

Example 1

A method of producing the oxynitride piezoelectric material represented by $Ba_{0.6}Bi_{0.4}Ti_{0.6}Si_{0.4}O_{2.6}N_{0.4}$ is described blow. This example corresponds to the case where an A atom, which occupies an A site, is formed of any one of a trivalent element Bi and a divalent element Ba, and a B atom, which occupies a B site, is formed of a tetravalent element Ti, and B' is formed of a tetravalent element Si. In other words, this example corresponds to the case where A represents Ba, B represents Ti, and B' represents Si in the above general formula (1).

Plate-like $BaTiO_3$ particles were used as shape anisotropic particles in this example. The plate-like $BaTiO_3$ particles each had the maximum plane with a <100> orientation. It should be appreciated that the shape anisotropic particles may be plate-like Bi layered compound particles, or may be a mixture of the plate-like $BaTiO_3$ particles and the plate-like Bi layered compound particles. Examples of the Bi layered compound include $Bi_4Ti_3O_{12}$ and $BaBi_4Ti_4O_{15}$.

Next, $Ba_{0.5}Bi_{0.5}Ti_{0.5}Si_{0.5}O_{2.5}N_{0.5}$ particles were used as matrix particles. $Ba_{0.5}Bi_{0.5}Ti_{0.5}Si_{0.5}O_{2.5}N_{0.5}$ was produced as follows. $BaCO_3$ (manufactured by Kojundo Chemical Lab. Co., Ltd., 99.99%), $TiO_2$ (manufactured by Kojundo Chemical Lab. Co., Ltd., 99.99%), $Bi_2O_2$ (manufactured by Kojundo Chemical Lab. Co., Ltd., 99.999%), and $SiO_2$ (manufactured by Kojundo Chemical Lab. Co., Ltd., 99.999%) were added to an ethanol solution at a molar ratio of 2:2:1:2 and mixed with a planetary ball mill for 1 hour. Bi may be deficient because of its high vapor pressure. Hence, it is desirably added in an excess amount based on the above-mentioned molar ratio.

After sufficient drying, the mixture was calcined using a tubular atmosphere furnace as illustrated in FIG. 3 in a dry ammonia gas (99.99%, flow rate: 0.5 cm$^3$/s) atmosphere. The calcination was performed under the following conditions: heating temperature: 900° C. to 1,000° C.; heating time: 80 hours; temperature rising rate: 5° C./min; and temperature falling rate: 10° C./min. The calcined powder was added to an ethanol solution and milled with a planetary ball mill for 1 hour.

The calcined powder after milling was dried, and the plate-like $BaTiO_3$ particles and the $Ba_{0.5}Bi_{0.5}Ti_{0.5}Si_{0.5}O_{2.5}N_{0.5}$ calcined powder were weighed at a molar ratio of 1:4. A mixed solution of 55 vol % of toluene and 45 vol % of ethanol was added to the weighed powder so that the weight ratio of the mixed solution would be 90 wt % with respect to the powder.

To the resultant, a binder (manufactured by Sekisui Chemical Co., Ltd., S-LEC (registered trademark) BH-3) and a plasticizer (butyl phthalate) were formulated so that the respective amounts would be 6 wt % with respect to the powder amount. The mixture was subjected to wet mixing with a ball mill for 5 hours to prepare a slurry.

Next, the slurry was molded into a tape having a thickness of 100 μm with a doctor blade apparatus, followed by drying. In addition, 25 sheets of the tape were stacked and bonded under pressure under a condition of 80° C.×100 kg/cm$^2$ (9.8 MPa)×10 min to provide a plate-like molded article having a thickness of 2.3 mm.

The plate-like molded article finally obtained was degreased in a nitrogen atmosphere under the following conditions: heating temperature: 600° C.; heating time: 2 hours; temperature rising rate: 200° C./h; and cooling rate: furnace cooling. In addition, the resultant was sintered in a nitrogen atmosphere under a condition of 1,200° C. to 1,400° C. for 1 hour to provide an oxynitride.

The obtained oxynitride had an average degree of orientation F(100) of 54%. The piezoelectric constant d33 determined with a d33 meter was 54 (pC/N), and as a result, the presence of piezoelectric properties was confirmed.

Example 2

A case in which A represents a divalent element Ba, B represents a tetravalent element Ti, and B' represents a tetravalent element Ge in the general formula (1): $A_{1-x}Bi_{x+\delta1}B_{1-y}B'_{y+\delta2}O_{3-z}N_z$ is described below.

$BaCO_3$ (manufactured by Kojundo Chemical Lab. Co., Ltd., 99.99%), $TiO_2$ (manufactured by Kojundo Chemical Lab. Co., Ltd., 99.99%), $Bi_2O_2$ (manufactured by Kojundo Chemical Lab. Co., Ltd., 99.999%), and $GeO_2$ (manufactured by Kojundo Chemical Lab. Co., Ltd., 99.999%) were used to form a green compact. The green compact was used as a target for a sputtering film formation. An RF-sputtering film formation was performed by using a gas of $N_2/O_2/Ar=4/1/20$ under a gas pressure ranging from 0.1 Pa to 0.7 Pa, on an La—Sr—TiO$_3$ substrate (100) having a temperature from 500° C. to 700° C., to thereby form a film having a thickness of 400 nm to 600 nm. A film being formed by the following conditions and having a composition of x=0.35 to 0.65 and y=0.35 to 0.65 was confirmed, by an X-ray analysis, to be a quality ABX$_2$-type perovskite compound without hetero-phase and to be a ferroelectric substance: the gas pressure of 0.2 Pa to 0.5 Pa and the substrate temperature of 550° C. to 650° C. Further, z, which represents an amount of nitrogen, was 0.35 to 0.5, and δ1 and δ2 were in a range within ±0.2.

As above, examples of the present invention are described in detail. However, the present invention is in no way limited to the above examples, and various modifications can be performed without departing from the gist of the present invention.

The oxynitride piezoelectric material according to the present invention can be utilized as, for example: piezoelectric materials, which are used for various sensors, such as an acceleration sensor, a pyroelectric sensor, an ultrasonic sensor, an electric field sensor, a temperature sensor, a gas sensor, a knock sensor, a yaw rate sensor, an air bag sensor, and a piezoelectric gyro sensor, energy conversion elements, such as a piezoelectric transducer, low-loss actuators or low-loss resonators, such as a piezoelectric actuator, an ultrasonic motor, and a resonator, an actuator of a liquid discharge apparatus, a capacitor, a bimorph piezoelectric element, a vibration pick-up, a piezoelectric microphone, a piezoelectric ignition element, a sonar, a piezoelectric buzzer, a piezoelectric speaker, a radiator, a filter, and the like; or dielectric materials, thermoelectric conversion materials, and ion conductive materials, which are used for a capacitor, a multilayer capacitor, and the like.

Further, the oxynitride piezoelectric material according to the present invention can also be utilized not only for a bulk, but also for a thin-film device. Examples of the thin-film device include a memory device, such as a ferroelectric substance memory, and a recording device, such as a thin-film ink-jet head.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-322831, filed Dec. 18, 2008, which is hereby incorporated by reference herein in its entirety.

What is claimed is:

1. An oxynitride piezoelectric material comprising a tetragonal perovskite-type oxynitride represented by the following general formula (1):

$$A_{1-x}Bi_{x+\delta1}B_{1-y}B'_{y+\delta2}O_{3-z}N_z \quad (1)$$

where A represents a divalent element, B and B' each represent a tetravalent element, x represents a numerical value of 0.35 or more to 0.6 or less, y represents a numerical value of 0.35 or more to 0.6 or less, z represents a numerical value of 0.35 or more to 0.6 or less, and δ1 and δ2 each represent a numerical value of −0.2 or more to 0.2 or less.

2. The oxynitride piezoelectric material according to claim 1, wherein N atoms are oriented in a c-axis direction.

3. The oxynitride piezoelectric material according to claim 1, wherein:
the A comprises at least one kind selected from Ba, Sr, and Ca; and
the B and the B' each comprise at least one kind selected from Ti, Zr, Hf, Si, Ge, and Sn.

4. The oxynitride piezoelectric material according to claim 1, wherein:
the A comprises Ba;
the B comprises Ti; and
the B' comprises Si.

5. The oxynitride piezoelectric material according to claim 1,
wherein the oxynitride comprises a tetragonal system and a ratio c/a of a c-axis length to an a-axis length in a unit cell is 1.15 or more to 1.269 or less.

6. A method of producing an oxynitride piezoelectric material represented by the following general formula (1):

$$A_{1-x}Bi_{x+\delta1}B_{1-y}B'_{y+\delta2}O_{3-z}N_z \quad (1)$$

where A represents a divalent element, B and B' each represent a tetravalent element, x represents a numerical value of 0.35 or more to 0.6 or less, y represents a numerical value of 0.35 or more to 0.6 or less, z represents a numerical value of 0.35 or more to 0.6 or less, and δ1 and δ2 each represent a numerical value of −0.2 or more to 0.2 or less; the oxynitride piezoelectric material containing, as a part of raw materials, shape anisotropic particles containing at least A and Bi, the method comprising:
orienting the shape anisotropic particles; and
sintering the shape anisotropic particles in an atmosphere containing nitrogen atoms.

7. The method of producing an oxynitride piezoelectric material according to claim 6, wherein:
the shape anisotropic particles are formed into a slurry by using a binder; and
the shape anisotropic particles are oriented by being subjected to a tape casting.

8. The method of producing an oxynitride piezoelectric material according to claim 6,
wherein the shape anisotropic particles are oriented by being sintered while being uniaxially pressurized.

* * * * *